(12) United States Patent
Hyun et al.

(10) Patent No.: US 7,961,018 B2
(45) Date of Patent: Jun. 14, 2011

(54) SEMICONDUCTOR DEVICE INCLUDING DELAY LOCKED LOOP HAVING PERIODICALLY ACTIVATED REPLICA PATH

(75) Inventors: Seok-Hun Hyun, Yongin-si (KR); Kye-Hyun Kyung, Yongin-si (KR); Jun-Ho Shin, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 46 days.

(21) Appl. No.: 12/588,571

(22) Filed: Oct. 20, 2009

(65) Prior Publication Data

US 2010/0097111 A1 Apr. 22, 2010

(30) Foreign Application Priority Data

Oct. 22, 2008 (KR) .................. 10-2008-0103834

(51) Int. Cl.
 *H03L 7/06* (2006.01)
(52) U.S. Cl. ..................... 327/158; 327/149
(58) Field of Classification Search .............. 327/149, 327/158
 See application file for complete search history.

(56) References Cited

U.S. PATENT DOCUMENTS

| | | | |
|---|---|---|---|
| 6,954,094 B2 | 10/2005 | Lee et al. | |
| 6,985,401 B2 * | 1/2006 | Jang et al. | 365/194 |
| 7,385,428 B2 * | 6/2008 | Lee et al. | 327/149 |
| 7,667,510 B2 * | 2/2010 | Shim et al. | 327/158 |
| 7,830,186 B2 * | 11/2010 | Yun et al. | 327/158 |
| 7,872,508 B2 * | 1/2011 | Ku et al. | 327/158 |
| 2007/0069778 A1 | 3/2007 | Choi et al. | |
| 2008/0079469 A1 | 4/2008 | Cho | |
| 2009/0273380 A1 * | 11/2009 | Shim et al. | 327/158 |
| 2010/0097111 A1 * | 4/2010 | Hyun et al. | 327/158 |

FOREIGN PATENT DOCUMENTS

| | | |
|---|---|---|
| JP | 2004-095155 A | 3/2004 |
| JP | 2007-097141 A | 4/2007 |
| KR | 10-2001-0004224 A | 1/2001 |
| KR | 10-2004-0020171 A | 3/2004 |
| KR | 10-2007-0036561 A | 4/2007 |

* cited by examiner

*Primary Examiner* — Lincoln Donovan
*Assistant Examiner* — Adam D Houston
(74) *Attorney, Agent, or Firm* — Lee & Morse, P.C.

(57) ABSTRACT

A delay locked loop adapted to delay an external clock signal and to output an internal clock signal, the delay locked loop including a renewal signal generator that outputs a renewal signal that is selectively activated and inactivated, a replica path that is active when the renewal signal is activated and is inactive when the renewal signal is inactivated, the replica path delaying the internal clock signal by a delay time of a normal path of a semiconductor device to output a replica internal clock signal when the renewal signal is activated, a control signal generator adapted to vary and to output a delay control signal according to a phase difference between the external and the replica internal clock signals, and a variable delay circuit adapted to delay the external clock signal by a time corresponding to the delay control signal and to output the internal clock signal.

14 Claims, 3 Drawing Sheets

SEMICONDUCTOR DEVICE INCLUDING DELAY LOCKED LOOP HAVING PERIODICALLY ACTIVATED REPLICA PATH

BACKGROUND

1. Field

Exemplary embodiments relate to a semiconductor device, and more particularly, to a semiconductor device including a delay locked loop including a periodically activated replica path.

2. Description of Related Art

A semiconductor device such as a synchronous semiconductor memory device inputs or outputs data in synchronization with an external clock signal. The semiconductor device may use a delay locked loop (DLL) to synchronize data that is input or output with the external clock signal.

SUMMARY

Embodiments are therefore directed to a delay locked loop and semiconductor devices including a delayed loop, which substantially overcome one or more of the problems due to the limitations and disadvantages of the related art.

It is therefore a feature of an embodiment to provide a delay locked loop having improved power consumption characteristics as compared to conventional phase locked loops.

It is therefore a separate feature of an embodiment to provide a delay locked loop that renews a delay time based on a certain period.

It is therefore a separate feature of an embodiment to provide a delay locked loop in which a control signal generator and/or a replica path are inactivated when a delay time is not being renewed.

At least one of the above and other features and advantages may be realized by providing a semiconductor device, including a delay locked loop configured to delay an external clock signal by a predetermined time to output an internal clock signal, and a normal path configured to output data generated inside the semiconductor device in response to the internal clock signal, wherein the delay locked loop, includes a renewal signal generator configured to output a renewal signal that is activated periodically, a replica path configured to delay the internal clock signal by a delay time of the normal path to output a replica internal clock signal when the renewal signal is activated, and to be inactivated when the renewal signal is inactivated, a control signal generator configured to vary and output a delay control signal according to a phase difference between the external clock signal and the replica internal clock signal in response to the renewal signal, and a variable delay circuit configured to delay the external clock signal by a time corresponding to the delay control signal to output the internal clock signal.

The control signal generator may be adapted to output the delay control signal without varying the delay control signal when the renewal signal is inactivated.

The renewal signal generator may include an oscillator configured to output an oscillator clock signal having a predetermined period, a frequency divider configured to divide the frequency of the oscillator clock signal to output a frequency-divided clock signal, and an output unit configured to generate and output the renewal signal in response to the frequency-divided clock signal.

The semiconductor device may include a reference clock generator configured to generate a reference clock signal having a predetermined period.

The output unit may be enabled in response to the frequency-divided clock signal, and activates the renewal signal for a predetermined time by counting pulses of the reference clock signal.

The semiconductor device may include a reference clock generator configured to output a reference clock signal having a predetermined period.

The renewal signal generator may include a frequency divider configured to divide the frequency of the reference clock signal to output a frequency-divided clock signal, and an output unit configured to generate and output the renewal signal in response to the frequency-divided clock signal.

The output unit may be enabled in response to the frequency-divided clock signal, and activates the renewal signal for a predetermined time by counting pulses of the reference clock signal.

The control signal generator may include a phase detector configured to operate in response to the renewal signal and output an up signal and a down signal according to the phase difference between the external clock signal and the replica internal clock signal, a counter configured to vary and output a counting signal in response to the up signal and the down signal, and a converter configured to convert the counting signal into the delay control signal, and output the delay control signal.

The variable delay circuit may include a plurality of delay elements connected in series, wherein each of the plurality of delay elements is enabled in response to the delay control signal and delays an input signal by a predetermined time to output a delayed signal.

At least one of the above and other features and advantages may be realized by providing a delay locked loop adapted to delay an external clock signal by a predetermined time to output an internal clock signal, the delay locked loop being employable with a semiconductor device including a normal path adapted to output data in accordance with the internal clock signal, the delay locked loop including a renewal signal generator adapted to output a renewal signal that is activated and inactivated based on a first clock signal, a replica path adapted to be active when the renewal signal is activated and to be inactive when the renewal signal is inactivated, the replica path being adapted to delay the internal clock signal by a delay time of the normal path and output a replica internal clock signal when the renewal signal is activated, a control signal generator adapted to vary and to output a delay control signal according to a phase difference between the external clock signal and the replica internal clock signal, and a variable delay circuit adapted to delay the external clock signal by a time corresponding to the delay control signal and to output the internal clock signal.

The renewal signal generator may include an oscillator adapted to output an oscillator clock signal having a predetermined period, a frequency divider adapted to divide the oscillator clock signal to output a frequency-divided clock signal and an output unit adapted to output the renewal signal based on the frequency divided clock signal, the first clock signal may be the oscillator clock signal.

The frequency divided clock signal may have a same period as a refresh period of the semiconductor device.

The control signal generator may include a phase detector adapted to receive the renewal signal and output an up signal or a down signal when the renewal signal is active to vary the delay control signal and adapted to maintain an existing delay control signal when the renewal signal is inactive.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2008-0103834, filed on Oct. 22, 2008, in the Korean Intellectual Property Office, and entitled: "Semiconductor Device Including Delay Locked Loop Having Periodically Activated Replica Path," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

A semiconductor device including a delay locked loop that has a periodically activated replica path according to example embodiments will now be described referring to attached drawings.

Figure 1:
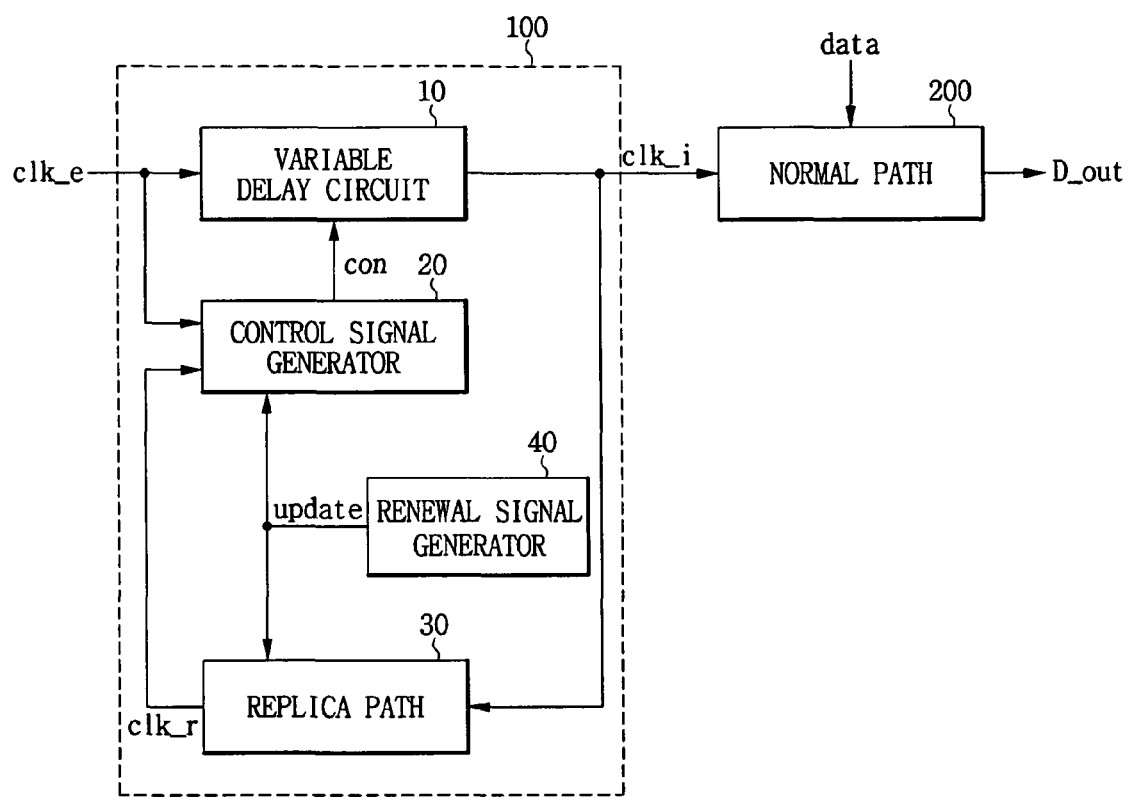
FIG. 1 illustrates a block diagram of a semiconductor device including a delay locked loop according to an exemplary embodiment.

FIG. 1 illustrates a block diagram of a semiconductor device including a delay locked loop according to an exemplary embodiment. The semiconductor device may include a delay locked loop 100 and a normal path 200. The delay locked loop 100 may include a variable delay circuit 10, a control signal generator 20, a replica path 30, and a renewal signal generator 40.

The delay locked loop 100 may delay an external clock signal (clk_e) by a predetermined time and may output a corresponding internal clock signal (clk_i). The external clock signal (clk_e) may be supplied from outside of the semiconductor device.

The variable delay circuit 10 may delay the external clock signal (clk_e) by a predetermined time in response to a delay control signal (con) and may output the internal clock signal (clk_i). The delay control signal (con) may be output from the control signal generator 20.

The renewal signal generator 40 may output a renewal signal (update) to the control signal generator 20 and/or the replica path 30. The control signal generator 20 may be enabled in response to the renewal signal (update). The control signal generator 20 may vary and output the delay control signal (con) according to a phase difference between the external clock signal (clk_e) and a replica internal clock signal (clk_r) output from the replica path 30. More particularly, e.g., when the renewal signal (update) is active, the control signal generator 20 may vary and output the delay control signal (con) to control a delay time of the variable delay circuit 10 in order to synchronize the external clock signal (clk_e) and the replica internal clock signal (clk_r).

When the renewal signal (update) is inactive, the control signal generator 20 may output the existing, e.g., previous, delay control signal (con) without varying the delay control signal (con).

The replica path 30, which may be a circuit replica of the normal path 200, may delay the internal clock signal (clk_i) by a same delay time as that of the normal path 200. The replica path 30 may output the replica internal clock signal (clk_r) in response to the renewal signal (update) from the renewal signal generator 40. More particularly, e.g., the replica path 30 may be turned on when the renewal signal (update) is active, and the replica path 30 may be turned off when the renew signal (update) is inactive. When the replica path 30 is turned on, the replica path 30 may delay and output the internal clock signal (clk_i) by the same delay time as that of the normal path 200.

The renewal signal generator 40 may output the renewal signal (update), which may be activated periodically.

The normal path 200 may receive internal data (data) generated in the semiconductor device and may output the internal data (data) (D_out) to the outside of the semiconductor device. The normal path 200 may output the output data (D_out) in response to the internal clock signal (clk_i), which may be output from the delay locked loop 100. Embodiments are not, however, limited thereto. For example, in the case of a semiconductor memory device (not shown), the internal data (data) may be input to the normal path 200 from a memory cell.

That is, the internal data (data) generated in the semiconductor device may be output as the output data (D_out) through the normal path 200 in response to the internal clock signal (clk_i) output from the delay locked loop 100. Though not shown in FIG. 1, the normal path 200 may include an output driver. Therefore, there may be a delay time difference between the internal clock signal clk_i and the output data D_out.

More particularly, e.g., when the renewal signal (update) is active, the replica path 30 is turned on, and may delay the internal clock signal (clk_i) by the delay time difference to output the replica internal clock signal (clk_r). Further, when the renewal signal (update) is active, the control signal generator 20 may vary and output the delay control signal (con) in response to the phase difference between the external clock signal (clk_e) and the replica internal clock signal (clk_r). The variable delay circuit 10 may delay the external clock signal (clk_e) in response to the delay control signal (con) to output the internal clock signal (clk_i). That is, the variable delay circuit 10 and the control signal generator 20 may delay the external clock signal (clk_e) and may output the internal clock signal (clk_i) to remove the phase difference between the external clock signal (clk_e) and the replica internal clock signal (clk_r).

In such exemplary embodiments, when the renewal signal (update) is inactive, the replica path 30 is turned off and does not operate. Further, when the renewal signal (update) is inactive, the control signal generator 20 may not vary the delay control signal (con) and may output the existing delay control signal (con).

Figure 2:
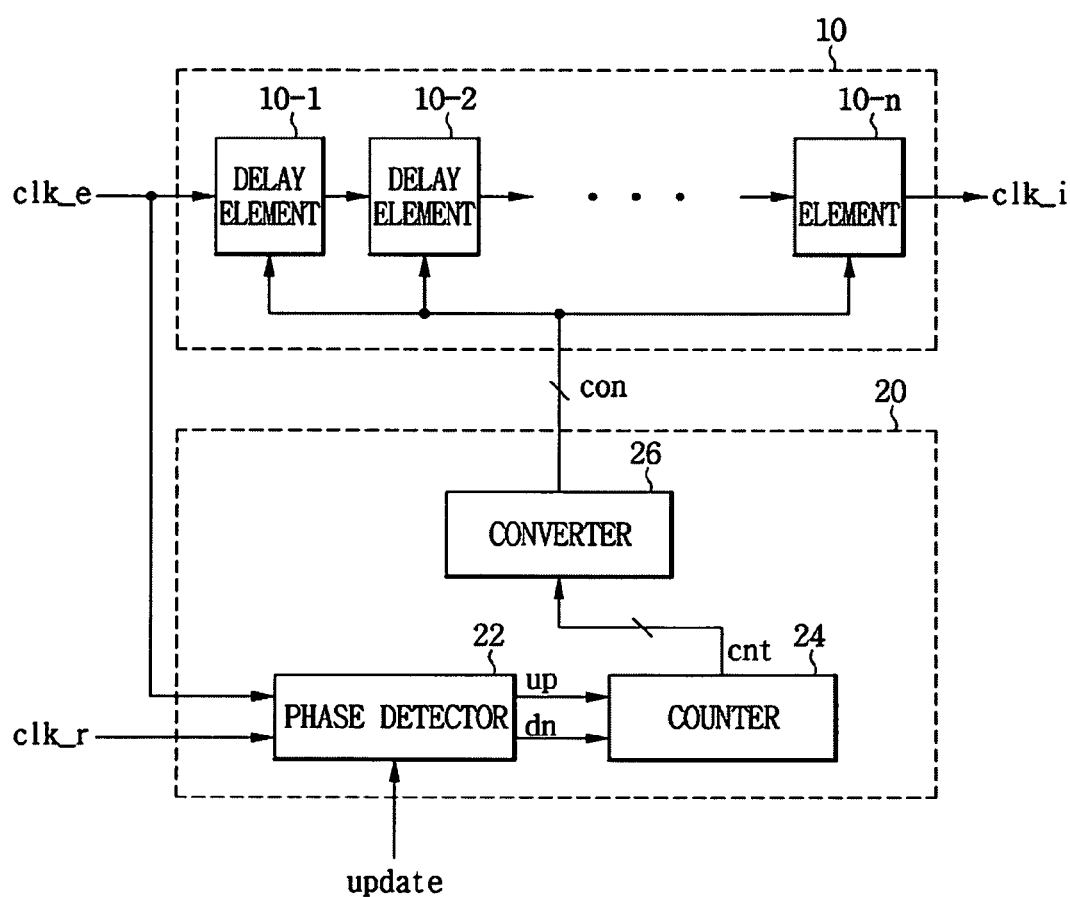
FIG. 2 illustrates a block diagram of a variable delay circuit and a control signal generator employable by the semiconductor device illustrated in FIG. 1.

FIG. 2 illustrates a block diagram of exemplary embodiments of the variable delay circuit 10 and the control signal generator 20 employable by the semiconductor device illustrated in FIG. 1.

The variable delay circuit 10 may include a plurality of delay elements 10-1, 10-2, . . . , 10-n connected in series. The control signal generator 20 may include a phase detector 22, a counter 24, and a converter 26.

Each of the plurality of delay elements 10-1, 10-2, ..., 10-n may be enabled in response to the delay control signal (con). Each of the plurality of delay elements 10-1, 10-2, ..., 10-n may delay an input signal by a predetermined time and may output the delayed signal.

The phase detector 22 may operate in response to the renewal signal (update), the external clock signal (clk_e) and the replica internal clock signal (clk_r). The phase detector may output an up signal (up) and/or a down signal (dn) according to the phase difference between the external clock signal (clk_e) and the replica internal clock signal (clk_r). For example, when the renewal signal (update) is active, the phase detector 22 may activate and output the up signal (up) when the phase of the replica internal clock signal (clk_r) leads the phase of the external clock signal (clk_e), and may activate and output the down signal (dn) when the phase of the external clock signal (clk_e) leads the phase of the replica internal clock signal (clk_r). When the renewal signal update is inactive, both the up signal (up) and the down signal (dn) may be inactive.

The counter 24 may vary and output a counting signal (cnt) in response to the up signal (up) and the down signal (dn) output from the phase detector 22. For example, the counter 24 may increase and output the counting signal (cnt) when the up signal (up) is activated, and may decrease and output the counting signal cnt when the down signal (dn) is activated.

The converter 26 may receive the counting signal (cnt) output from the counter 24, may convert the counting signal (cnt) into the delay control signal (con), and may output the converted signal. For example, the converter 26 may convert the counting signal (cnt) into the delay control signal (con) corresponding to a thermometer code.

More particularly, in an example embodiment of the control signal generator 20 of the semiconductor device having a delay locked loop shown in FIG. 2, the control signal generator 20 may output the delay control signal (con) corresponding to a thermometer code that varies according to the phase difference between the external clock signal (clk_e) and the replica internal clock signal (clk_r) when the renewal signal (update) is active. When the renewal signal (update) is inactive, the control signal generator 20 may not vary the delay control signal (con). Further, in an example embodiment of the variable delay circuit 10, a delay time may be varied by varying the number of operating delay elements of the plurality of delay elements 10-1, 10-2, ..., 10-n in response to the delay control signal (con) corresponding to a thermometer code. Therefore, the external clock signal (clk_e) input to the variable delay circuit 10 may be delayed by the varied delay time and may be output as the internal clock signal (clk_i).

In FIG. 2, the variable delay circuit 10 including the plurality of delay elements 10-1, 10-2, ..., 10-n, and the control signal generator 20 including the phase detector 22, the counter 24, and the converter 26 are illustrated as examples. However, the variable delay circuit 10 and the control signal generator 20 may be implemented using various methods.

Figure 3:
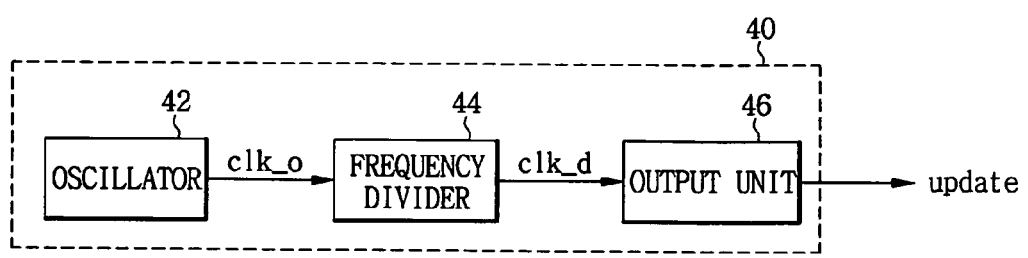
FIG. 3 illustrates a block diagram of a renewal signal generator employable by the semiconductor memory device illustrated in FIG. 1.

FIG. 3 illustrates a block diagram of an exemplary embodiment of the renewal signal generator 40 employable by the semiconductor memory device illustrated in FIG. 1.

The renewal signal generator 40 may include an oscillator 42, a frequency divider 44, and an output unit 46.

The oscillator 42 may output an oscillator clock signal (clk_o) having a predetermined period. In the case of a semiconductor memory device, e.g., the period of the oscillator clock signal (clk_o) may have the same value as a refresh period of the semiconductor memory device.

The frequency divider 44 may divide the frequency of the oscillator clock signal (clk_o) and may output a frequency-divided clock signal (clk_d) having a predetermined period, i.e., a period with which the delay locked loop 100 renews a delay time.

The output unit 46 may output the renewal signal (update) that may be activated for a predetermined time in response to the frequency-divided clock signal (clk_d). For example, the output unit 46 may be configured to output the renewal signal (update) in an active state for a predetermined time when a rising edge of the frequency-divided clock signal (clk_d) is sensed. Further, e.g., in some embodiments, the output unit 46 may include a counter that receives the oscillator clock signal (clk_o), the external clock signal (clk_e), the internal clock signal (clk_i), and/or a reference clock signal generated from a reference clock generator of a semiconductor device and counts the number of pulses of the oscillator clock signal (clk_o), the external clock signal (clk_e), the internal clock signal (clk_i), and/or the reference clock signal to determine a time period during which the renewal signal (update) is active.

In FIG. 3, the renewal signal generator 40, including the oscillator 42, and the frequency divider 44 that divides the frequency of the oscillator clock signal (clk_o) output from the oscillator 42, are illustrated as examples. Alternatively, e.g., the frequency divider 44 of the renewal signal generator 40 may receive and divide a signal output from an oscillator provided, e.g., as part of a semiconductor device.

Figure 4:
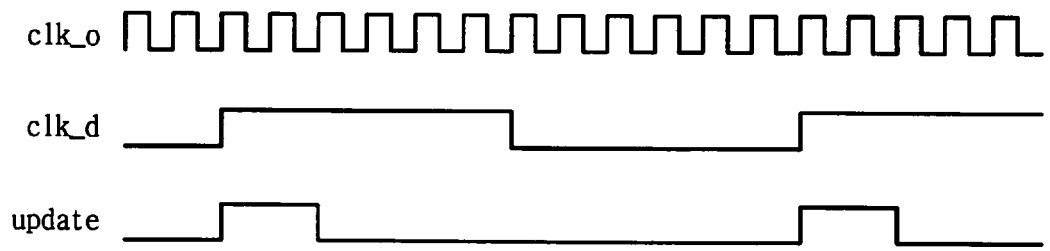
FIG. 4 illustrates a timing diagram of operations of the renewal signal generator of the semiconductor device illustrated in FIG. 3.

FIG. 4 illustrates a timing diagram of exemplary operations of the renewal signal generator 40 of the semiconductor device illustrated in FIG. 3.

In FIG. 4, (clk_o) denotes an oscillator clock signal output from the oscillator 42, (clk_d) denotes a frequency-divided clock signal output from the frequency divider 44, and (update) denotes a renewal signal output from the output unit 46.

The oscillator 42 may output an oscillator clock signal (clk_o) having a predetermined period.

The frequency divider 44 may divide the frequency of the oscillator clock signal (clk_o) and may output a frequency-divided clock signal (clk_d).

The output unit 46 may output a renewal signal (update) that is active for a predetermined time in response to the frequency-divided clock signal (clk_d), e.g., from a point in time when a rising edge of the frequency-divided clock signal (clk_d) is sensed.

That is, in a semiconductor device having a delay locked loop including one or more features of the exemplary embodiments described above, a delay locked loop may renew a delay time according to a certain period, and may turn off a control signal generator and a replica path while not renewing the delay time.

Therefore, a semiconductor memory device including one or more features described above may, e.g., decrease power consumption by periodically activating a replica path of a delay locked loop.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
    a delay locked loop configured to delay an external clock signal by a predetermined time to output an internal clock signal; and a normal path configured to output data generated inside the semiconductor device in response to the internal clock signal, wherein the delay locked loop, includes:
- a renewal signal generator configured to output a renewal signal that is activated periodically;
- a replica path configured to delay the internal clock signal by a delay time of the normal path to output a replica internal clock signal when the renewal signal is activated, and to be inactivated when the renewal signal is inactivated;
- a control signal generator configured to vary and output a delay control signal according to a phase difference between the external clock signal and the replica internal clock signal in response to the renewal signal; and
- a variable delay circuit configured to delay the external clock signal by a time corresponding to the delay control signal to output the internal clock signal.

2. The semiconductor device as claimed in claim 1, wherein the control signal generator is adapted to output the delay control signal without varying the delay control signal when the renewal signal is inactivated.

3. The semiconductor device as claimed in claim 1, wherein the renewal signal generator, comprises:
- an oscillator configured to output an oscillator clock signal having a predetermined period;
- a frequency divider configured to divide the frequency of the oscillator clock signal to output a frequency-divided clock signal; and
- an output unit configured to generate and output the renewal signal in response to the frequency-divided clock signal.

4. The semiconductor device as claimed in claim 3, further comprising:
- a reference clock generator configured to generate a reference clock signal having a predetermined period.

5. The semiconductor device as claimed in claim 4, wherein the output unit is enabled in response to the frequency-divided clock signal, and activates the renewal signal for a predetermined time by counting pulses of the reference clock signal.

6. The semiconductor device as claimed in claim 1, further comprising:
- a reference clock generator configured to output a reference clock signal having a predetermined period.

7. The semiconductor device as claimed in claim 6, wherein the renewal signal generator comprises:
- a frequency divider configured to divide the frequency of the reference clock signal to output a frequency-divided clock signal; and
- an output unit configured to generate and output the renewal signal in response to the frequency-divided clock signal.

8. The semiconductor device as claimed in claim 7, wherein the output unit is enabled in response to the frequency-divided clock signal, and activates the renewal signal for a predetermined time by counting pulses of the reference clock signal.

9. The semiconductor device as claimed in claim 1, wherein the control signal generator comprises:
- a phase detector configured to operate in response to the renewal signal and output an up signal and a down signal according to the phase difference between the external clock signal and the replica internal clock signal;
- a counter configured to vary and output a counting signal in response to the up signal and the down signal; and
- a converter configured to convert the counting signal into the delay control signal, and output the delay control signal.

10. The semiconductor device as claimed in claim 1, wherein the variable delay circuit comprises a plurality of delay elements connected in series, wherein each of the plurality of delay elements is enabled in response to the delay control signal and delays an input signal by a predetermined time to output a delayed signal.

11. A delay locked loop adapted to delay an external clock signal by a predetermined time to output an internal clock signal, the delay locked loop being employable with a semiconductor device including a normal path adapted to output data in accordance with the internal clock signal, the delay locked loop comprising:
- a renewal signal generator adapted to output a renewal signal that is activated and inactivated based on a first clock signal;
- a replica path adapted to be active when the renewal signal is activated and to be inactive when the renewal signal is inactivated, the replica path being adapted to delay the internal clock signal by a delay time of the normal path and output a replica internal clock signal when the renewal signal is activated;
- a control signal generator adapted to vary and to output a delay control signal according to a phase difference between the external clock signal and the replica internal clock signal; and
- a variable delay circuit adapted to delay the external clock signal by a time corresponding to the delay control signal and to output the internal clock signal.

12. The delay locked loop as claimed in claim 11, wherein the renewal signal generator includes an oscillator adapted to output an oscillator clock signal having a predetermined period, a frequency divider adapted to divide the oscillator clock signal to output a frequency-divided clock signal and an output unit adapted to output the renewal signal based on the frequency divided clock signal, the first clock signal is the oscillator clock signal.

13. The delay locked loop as claimed in claim 12, wherein the frequency divided clock signal has a same period as a refresh period of the semiconductor device.

14. The delay locked loop as claimed in 11, wherein the control signal generator includes a phase detector adapted to receive the renewal signal and output an up signal or a down signal when the renewal signal is active to vary the delay control signal and adapted to maintain an existing delay control signal when the renewal signal is inactive.

* * * * *